(12) United States Patent
Hsieh et al.

(10) Patent No.: US 7,531,756 B2
(45) Date of Patent: May 12, 2009

(54) SHIELDING APPARATUS

(75) Inventors: Shen-Kwang Hsieh, Taipei Hsien (TW); Kuo-Chih Kuo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/946,853

(22) Filed: Nov. 29, 2007

(65) Prior Publication Data

US 2008/0251290 A1 Oct. 16, 2008

(30) Foreign Application Priority Data

Apr. 16, 2007 (CN) .................... 2007 1 0200460

(51) Int. Cl.
*H05K 9/00* (2006.01)
*G01R 31/02* (2006.01)
(52) U.S. Cl. ................ 174/382; 174/377; 324/537
(58) Field of Classification Search ............. 174/350, 174/377, 382; 361/816, 818, 800; 324/754, 324/755, 537
See application file for complete search history.

(56) References Cited

U.S. PATENT DOCUMENTS

| | | | | |
|---|---|---|---|---|
| 3,578,749 | A * | 5/1971 | Woten | 49/387 |
| 5,300,881 | A * | 4/1994 | Ferrer et al. | 324/754 |
| 5,572,144 | A * | 11/1996 | Davidson et al. | 324/755 |
| 5,717,160 | A | 2/1998 | Bootle | |
| 5,831,160 | A * | 11/1998 | Steketee | 73/431 |
| 5,847,938 | A | 12/1998 | Gammon | |
| 6,469,495 | B1 | 10/2002 | Boswell et al. | |
| 7,388,160 | B2 * | 6/2008 | Mok et al. | 174/382 |
| 2004/0257097 | A1 * | 12/2004 | Beaucag et al. | 324/754 |

* cited by examiner

*Primary Examiner*—Hung V Ngo
(74) *Attorney, Agent, or Firm*—Frank R. Niranjan

(57) ABSTRACT

A shielding apparatus for electromagnetic testing comprises a platform, a lid, a driving unit, a pulley system, and a counterbalance. The platform is for placing an electronic device to be tested. The lid is for covering the platform to define a closed space. The driving unit is for lifting and lowering the lid. The counterbalance connected to the lid via the pulley system is for partly or substantially counterbalancing a weight of the lid.

20 Claims, 3 Drawing Sheets

SHIELDING APPARATUS

BACKGROUND

1. Field of the Invention

The present invention relates to shields for protecting electronic equipments from electromagnetic interference, and particularly to a shielding apparatus for electromagnetic testing.

2. Description of Related Art

Electronic devices such as cellular telephones and notebook computers, etc. are always tested before being sold to the public so as to ensure quality assurance of the electronic devices. Testing these electronic devices requires electromagnetic shielding in order to protect the electronic products from interference with other electromagnetic waves, such as radio frequency (RF) waves.

Traditionally, a shield is provided in a form of a shielding box which includes a base and a lid. When the electronic device is tested, the electronic device is placed in the base of the shielded box and the lid is manually placed over the base thereby forming an enclosed space. Within this enclosed space the electronic device is free of interference from outside electromagnetic waves because the base and the lid of the shielding box blocks or absorbs electromagnetic waves. However, in practice, the lid is heavy, and furthermore, manually moving the lid over the base may cause injuries.

Therefore, a shielding apparatus for electromagnetic testing is needed in the industry to address the aforementioned deficiencies and inadequacies.

SUMMARY

A shielding apparatus for electromagnetic testing comprises a platform, a lid, a driving unit, a pulley system, and a counterbalance. The platform is for placing an electronic device to be tested. The lid is for covering the platform to define a closed space. The driving unit is for lifting and lowering the lid. The counterbalance connected to the lid via the pulley system is for partly or substantially counterbalancing a weight of the lid.

Other systems, methods, features, and advantages of the present shielding apparatus for electromagnetic testing will be or become apparent to one with skill in the art upon examination of the following drawings and detailed description. It is intended that all such additional equipments, features, and advantages be included within this description, be within the scope of the present device, and be protected by the accompanying claims.

BRIEF DESCRIPTION OF THE DRAWINGS

Many aspects of the present shielding apparatus and the present shielding apparatus can be better understood with reference to following drawings. Components in the drawings are not necessarily to scale, emphasis instead being placed upon clearly illustrating the principles of the present shielding apparatus. Moreover, in the drawings, like reference numerals designate corresponding parts throughout the several views.

DETAILED DESCRIPTION OF THE EMBODIMENTS

Reference will now be made to the drawings to describe a preferred embodiment of the present shielding apparatus.

Figure 1:
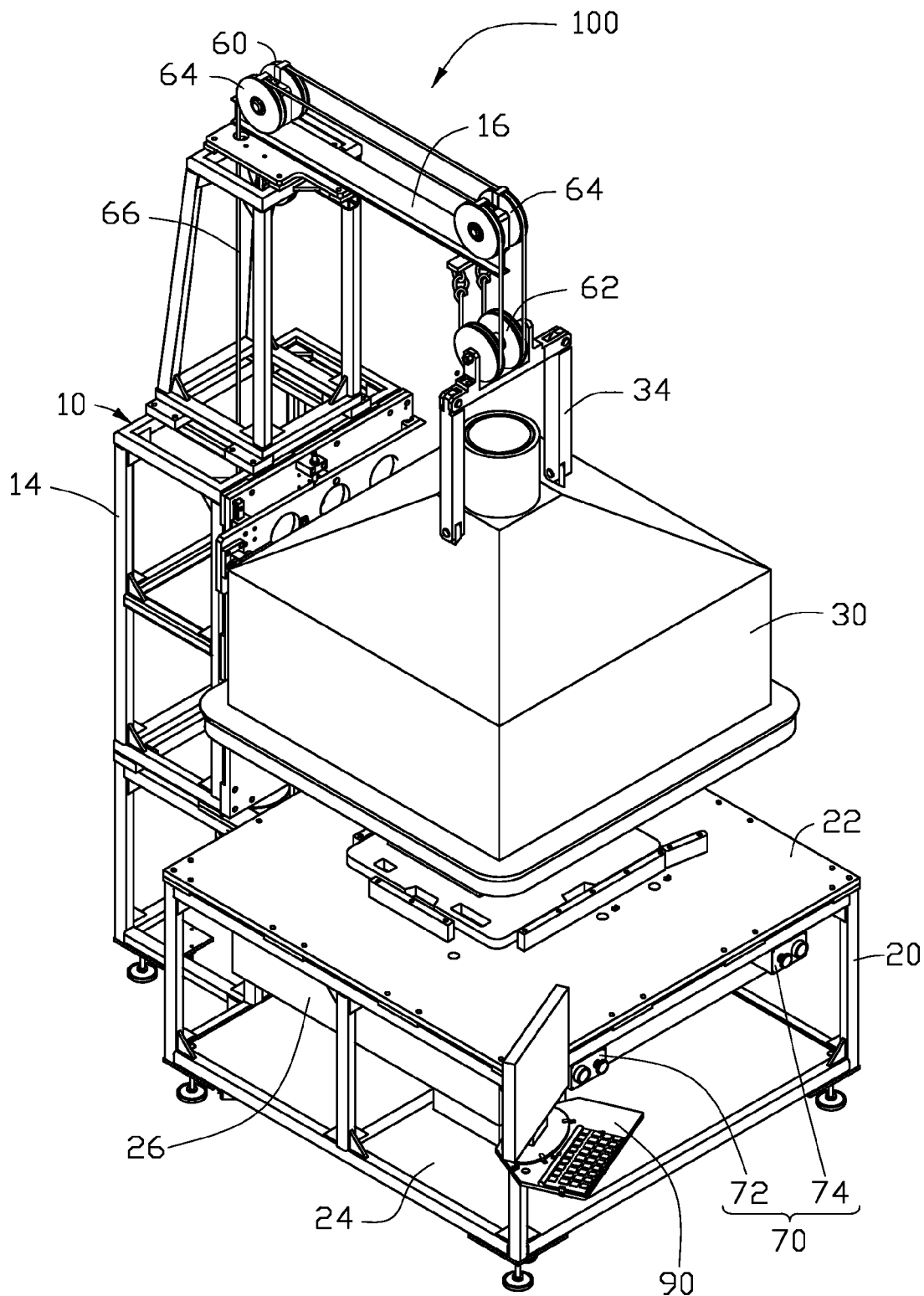
FIG. 1 is an isometric view of a shielding apparatus in accordance with an exemplary embodiment.
Figure 2:
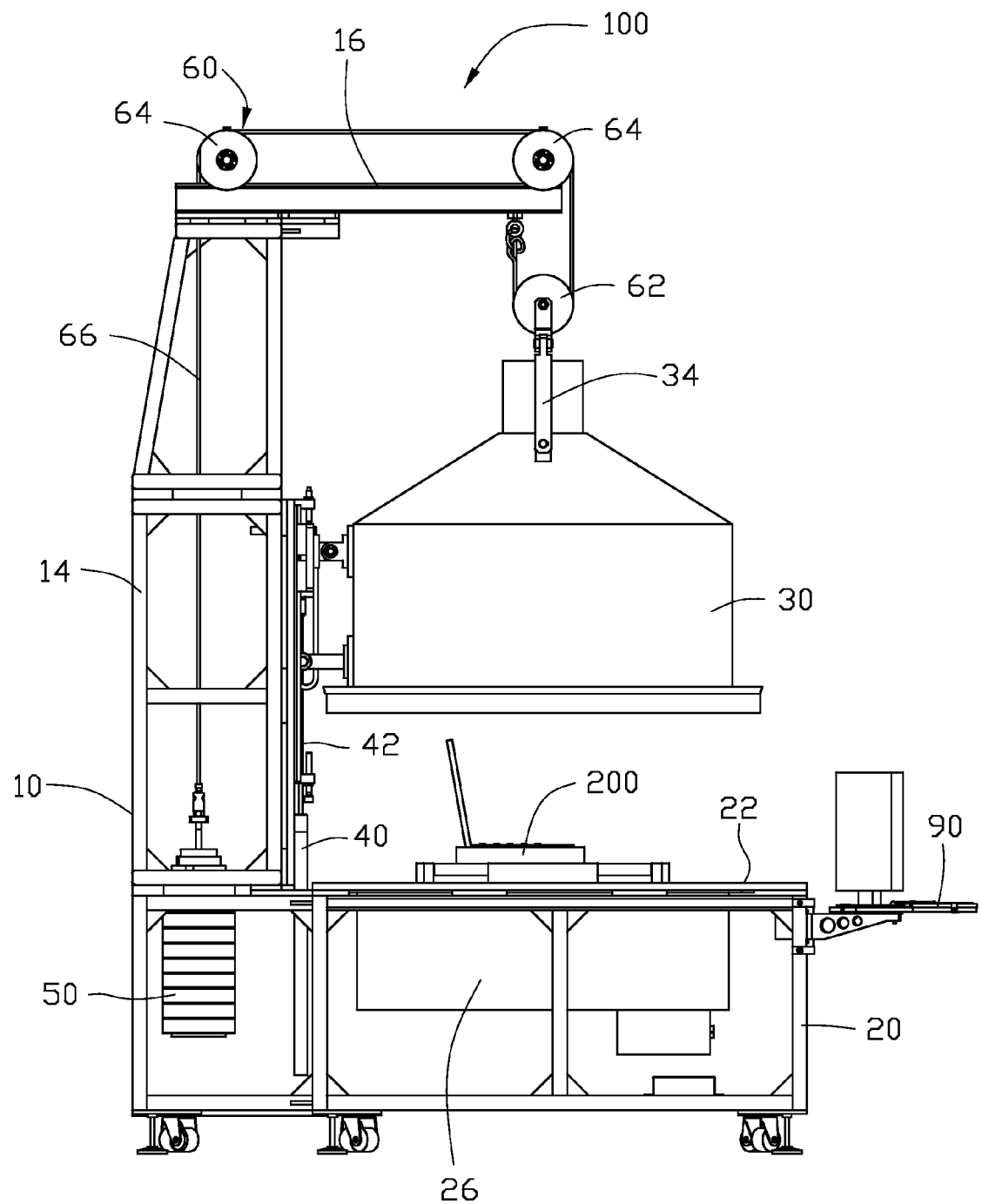
FIG. 2 is a side view of the shielding apparatus of FIG. 1.

Referring to FIGS. 1 and 2, a shielding apparatus 100 is used for testing a notebook computer 200 in accordance with an exemplary embodiment. The shielding apparatus 100 includes a hoist 10, a lid 30, and a platform 20 extending perpendicularly near a bottom of the hoist 10. The platform 20 is used for placing the notebook computer 200 to be tested. The platform 20 includes an upper board 22 and a lower board 24. A bottom shield plate 26 is fixed to a bottom surface (not labeled) of the upper board 22. The lid 30 defines a cavity 32 (referring to FIG. 3) therein. The hoist 10 is used for lifting and lowering the lid 30. The hoist 10 includes a supporting structure 14, a fixed extending arm 16, a driving unit 40, a counterbalance 50, and a pulley system 60. The arm 16 extends horizontally out from a top of the supporting structure 14.

In the embodiment, the pulley system 60 includes a pair of movable pulleys 62, two pairs of fixed pulleys 64 and a wire 66. A first pair of fixed pulleys 64 is configured on one end of the arm 16, and a second pair of fixed pulleys 64 is configured on an outer end of the arm 16. The pair of moveable pulleys 62 is positioned substantially vertical below the second pair of fixed pulleys 64 above the platform 20. A bracket 34 is fixed to the pair of movable pulleys 62. The lid 30 is fixed to the bracket 34. The wire 66 is preferable a steel wire. The steel wire 66 is folded and the ends of the steel wire 66 are correspondingly inserted through the pulley system 60 and tightly attached to the arm 16. The counterbalance 50 is hooked to the fold of steel wire 66. The counterbalance 50 is for partly or substantially counterbalancing the weight of the lid 30 via the pulley system 60. The movable pulley 62 is adopted for decreasing work needed to lift and lower the lid 30. A weight of the counterbalance 50 may be equal to or less than half a weight of the lid 30.

The driving unit 40 is preferably a pneumatic pump. In other embodiments, a hydraulic pump can be used as a driving unit instead of the pneumatic pump 40. The pneumatic pump 40 includes a cylinder (not labeled) fixed to a side of the supporting structure 14, and a piston rod 42 with an end fitting snugly into the cylinder and moves under pneumatic pressure. The other end of the piston rod 42 is fixed to a side of the lid 30. The pneumatic pump 40 is used for lifting and lowering the lid 30, thus controlling the lid 30 to rise above the platform 20 or land on the platform 20.

The pneumatic pump 40 is controlled by a control panel 70 configured on the platform 20. When testing the notebook computer 200, a start button (not labeled) of the control panel 70 is actuated, the pneumatic pump 40 releases the piston rod 42 inwards, and the lid 30 is lowered until it lands on the top of the platform 20 to define a closed space that shields electromagnetic interference. When the test is done, a finish button (not labeled) of the control panel 70 is actuated, the pneumatic pump 40 drives the piston rod 42 outwards to a predetermined height, thus lifting the lid 30 upwards away from the platform 20, while the counterbalance 50 is lowered, the notebook computer 200 can be removed from the platform 20.

As described above, the pulley system 60 and the counterbalance 50 are for partly or substantially counterbalancing the weight of the lid 30, as a result, the pneumatic pump 40 needs less work to lift the lid 30, and any injuries due to a force of a landing/falling lid on a user's hand is also reduced. Thus, the shielding apparatus 100 can prevent serious injuries caused when a user accidentally places his/her hands on the platform 20 in a moving path when the lid 30 lowers/falls.

Furthermore, in the embodiment, the control panel 70 can include two control units 72, 74. Each of the control units 72 and 74 includes a start button and a finish button (not labeled). The piston rod 42 lowers only when the two start buttons are actuated at a same time, and raises when one of the start buttons is actuated. The hands of the user would not be hurt by the lid 30 when the lid 30 lowers/falls, as both hands of the user are occupied pressing the two start buttons, thus effectively preventing harm caused by mis-operations.

Figure 3:
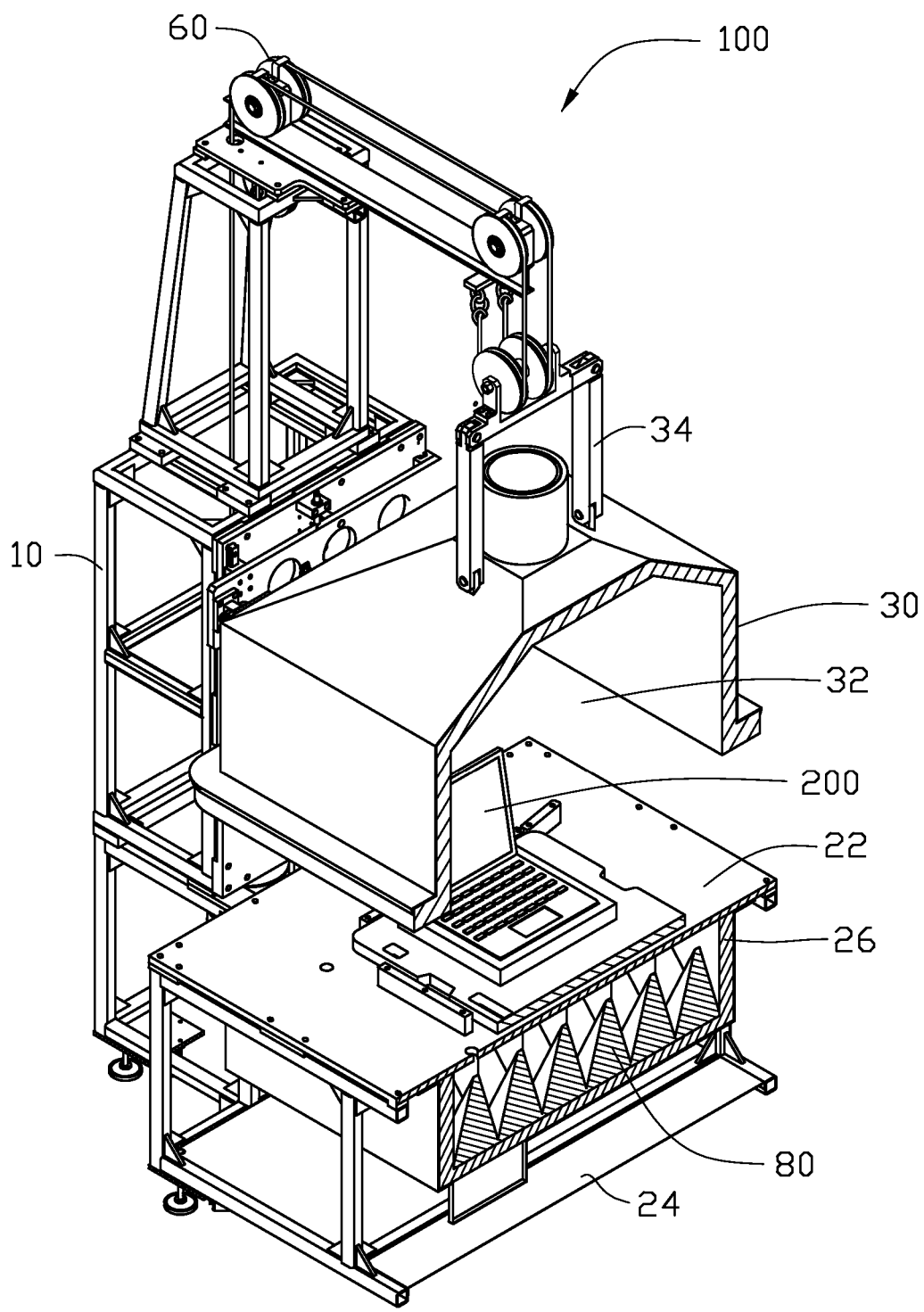
FIG. 3 is a cutaway view of the shielding apparatus of FIG. 1.

Referring to FIG. 3, an absorbing layer 80 made of electromagnetic wave absorbing materials is disposed inside the bottom shield plate 26. The absorbing layer 80 is configured for absorbing electromagnetic waves to enhance the efficiency of shielding. It can be easily understood that the absorbing layer 80 can also be disposed inside the lid 30.

The shielding apparatus 100 also includes a control computer 90 for controlling an electromagnetic test and displaying the result of the electromagnetic test.

In other embodiments, the pulley system 60 only includes a movable pulley 62 and two fixed pulleys 64 and a wire 66. One of the fixed pulleys 64 is configured on one end of the arm 16, and the other fixed pulley 64 is configured on the outer end of the arm 16. The moveable pulley 62 is configured vertically under the other fixed pulley 64 above the platform. The wire 66 is correspondingly inserted through the pulley system 60, one of its end is fixed to the arm 16, and the other end is fixed to the counterbalance 50.

It should be emphasized that the above-described preferred embodiment, is merely a possible example of implementation of the principles of the invention, and is merely set forth for a clear understanding of the principles of the invention. Many variations and modifications may be made to the above-described embodiment of the invention without departing substantially from the spirit and principles of the invention. All such modifications and variations are intended to be included herein within the scope of this disclosure and the present invention and be protected by the following claims.

What is claimed is:

1. A shielding apparatus comprising:
   a platform for placing an electronic device to be tested;
   a lid for covering the platform to define a closed space;
   a driving unit for lifting and lowering the lid;
   a pulley system; and
   a counterbalance, connected to the lid via the pulley system, for partly or substantially counterbalancing a weight of the lid.

2. The shielding apparatus according to claim 1, further comprising a supporting structure and an arm extending horizontally out from a top of the supporting structure.

3. The shielding apparatus according to claim 2, wherein the driving unit is fixed to the supporting structure.

4. The shielding apparatus according to claim 2, wherein the pulley system comprises at least a movable pulley connected to the lid via a bracket.

5. The shielding apparatus according to claim 4, wherein the pulley system comprises at least a fixed pulley fixed to the arm.

6. The shielding apparatus according to claim 5, wherein the pulley system comprises a rope inserted through the pulley system; the rope comprises a first end fixed to the supporting structure and a second end fixed to the counterbalance.

7. The shielding apparatus according to claim 1, wherein the platform comprises an upper board, the shielding apparatus further comprising a bottom shield plate fixed to a bottom surface of the upper board.

8. The shielding apparatus according to claim 7, further comprising an absorbing unit made of electromagnetic wave absorbing materials disposed inside the bottom shield plate or the lid.

9. The shielding apparatus according to claim 1, wherein the driving unit is a pneumatic pump.

10. The shielding apparatus according to claim 1, wherein the driving unit is a hydraulic pump.

11. The shielding apparatus according to claim 1, further comprising a control panel for controlling the driving unit.

12. The shielding apparatus according to claim 11, wherein the control panel comprises two control units, each control units comprises a start button; and the piston rod lowers when the two start buttons are actuated at a same time.

13. A shielding apparatus comprising:
    a platform for placing an electronic device to be tested;
    a lid for covering the platform to define a closed space;
    a driving unit for lifting and lowering the lid;
    a pulley system; and
    a counterbalance connected to the lid via the pulley system;
    wherein the counterbalance is for balancing a weight of the lid, and a weight of the counterbalance is equal to or lighter than half the weight of the lid.

14. The shielding apparatus according to claim 13, further comprising a supporting structure and an arm extending horizontally out from a top of the supporting structure.

15. The shielding apparatus according to claim 14, wherein the driving unit is fixed to the supporting structure.

16. The shielding apparatus according to claim 14, wherein the pulley system comprises at least a movable pulley connected to the lid via a bracket.

17. The shielding apparatus according to claim 16, wherein the pulley system comprises at least a fixed pulley fixed on the arm.

18. The shielding apparatus according to claim 17, wherein the pulley system comprises a rope inserted through the pulley system; the rope comprises a first end fixed to the supporting structure and a second end fixed to the counterbalance.

19. The shielding apparatus according to claim 13, wherein the platform comprises an upper board, the shielding apparatus further comprising a bottom shield plate fixed to a bottom surface of the upper board, and an absorbing unit made of electromagnetic wave absorbing materials disposed inside the bottom shield plate or the lid.

20. The shielding apparatus according to claim 13, further comprising a control panel for controlling the driving unit, wherein the control panel comprises two control units, each control units comprises a start button; and the piston rod lowers when the two start buttons are actuated at the same time.

* * * * *